(12) United States Patent
McCormack et al.

(10) Patent No.: US 7,424,400 B2
(45) Date of Patent: Sep. 9, 2008

(54) METHOD OF MONITORING LINE FAULTS IN A MEDIUM VOLTAGE NETWORK

(75) Inventors: Michael Anthony McCormack, County Clare (IE); Charles Brendan O'Sullivan, County Limerick (IE)

(73) Assignee: FMC Tech Limited, Galway (IE)

( * ) Notice: Subject to any disclaimer, the term of this patent is extended or adjusted under 35 U.S.C. 154(b) by 0 days.

(21) Appl. No.: 11/570,006

(22) PCT Filed: Jun. 7, 2005

(86) PCT No.: PCT/IE2005/000062

§ 371 (c)(1),
(2), (4) Date: Aug. 20, 2007

(87) PCT Pub. No.: WO2005/119277

PCT Pub. Date: Dec. 15, 2005

(65) Prior Publication Data

US 2008/0097706 A1    Apr. 24, 2008

(30) Foreign Application Priority Data

Jun. 4, 2004  (IE) .............................. S2004/0391

(51) Int. Cl.
*G01F 19/00*  (2006.01)
*G01R 31/08*  (2006.01)
(52) U.S. Cl. ...................... 702/188; 324/512
(58) Field of Classification Search ................ 702/188, 702/182–185, 60–64; 324/500, 512

See application file for complete search history.

(56) References Cited

U.S. PATENT DOCUMENTS

2003/0220752 A1 * 11/2003 Hart ............................. 702/61
2004/0186670 A1 *  9/2004 Hart ............................. 702/57

* cited by examiner

*Primary Examiner*—Edward Raymond
(74) *Attorney, Agent, or Firm*—Holland & Knight LLP; Brian J Colandreo, Esq

(57) ABSTRACT

The present invention relates to a method of monitoring line faults in a medium voltage network (1) of the type comprising an electricity generating plant (3) supplying electricity to a plurality of customers over a network of medium voltage power lines (5), a control centre computer (9) and a plurality of measurement sensors (7) located remote from the electricity generating plant on the medium voltage power lines, each of the measurement sensors (7) further comprising three individual measurement units, each measurement unit mounted on a different phase of the medium voltage power line (5) with respect to the other measurement units of that measurement sensor, and each measurement sensor (7) having means to communicate with the control centre computer (9). The method includes the steps of synchronizing the measurement sensors (7) and thereafter calculating the out of balance current for the medium voltage line (5) on a cycle by cycle basis. On the measurement sensor (7) detecting a fault in the line a line fault measurement report is sent to a control centre computer (9) for further analysis. The method allows for the determination of the likely cause of a fault as well as the likely location of a fault.

30 Claims, 2 Drawing Sheets

METHOD OF MONITORING LINE FAULTS IN A MEDIUM VOLTAGE NETWORK

RELATED APPLICATIONS

The subject application is a U.S. National Stage application that claims the priority of International Application No. PCT/IE2005/000062, filed on 07 Jun. 2005, which claims the priority of Irish National Application No.: S2004/0391, filed on 04 Jun. 2004.

FIELD OF THE INVENTION

This invention relates to a method of monitoring line faults in a medium voltage network.

BACKGROUND OF THE INVENTION

Nowadays, due to the deregulation of the Electricity Sector and in particular the deregulation of the medium voltage networks, the business of supplying electricity to customers over the medium voltage network is becoming more and more competitive. Providers of electricity are always looking for new ways to cut the costs of supplying the electricity to their customers. At the same time, the electricity providers are also being forced to provide a more reliable service to their customers with as few interruptions to the power supply as possible in order to satisfy their customer's demands as well as the demands of the Industry regulatory bodies.

In order to satisfy both of these requirements it has been found that by monitoring their networks more closely than ever before, the electricity providers may reduce the losses from the medium voltage network as well as being able to attend to any failures in the medium voltage network in as fast a manner as possible. This has been found to both reduce the overall cost of producing the electricity and to guarantee a faster response to any faults that may occur in the medium voltage network. There is a problem however with the known methods of monitoring the networks in that often the information provided by the measurement sensors will not be sufficiently accurate to give a true impression of what is actually happening on the medium voltage lines and it will have to await a fault condition in the line before any action is taken to rectify the problem.

Another problem with the known methods of monitoring the medium voltage network is that these methods only operate on overhead power lines. Nowadays, more and more of the power lines installed, particularly in and around cities, are subterranean lines and not overhead lines as was previously the case. The problem with subterranean power lines is that these lines experience a large capacitive current in the lines as compared to overhead lines. Therefore, when a line transitions from an overhead line to a subterranean line a significant change in the line condition occurs, this causes the known methods of monitoring the lines to produce erroneous measurements and results.

This is partly due to the manner in which the lines are being monitored, using sample by sample analysis of the lines. By using this technique, the methods are limited in the accuracy that they can achieve particularly when the lines contain subterranean portions. Therefore, the known methods are unsuitable for accurately measuring medium voltage networks in and around cities and other areas where a large portion of the medium voltage line is located underground.

Another problem with the known methods of monitoring the medium voltage networks is that the monitoring systems are purely reactive in that the systems always await a fault condition before taking any corrective action on the line. Quite often, this is in fact too late as the fault may be a significant fault resulting in a black out of power to an area which can greatly inconvenience the customers of the medium voltage network electricity supplier. This can result in the customers becoming dissatisfied with their electricity provider and looking for an alternative provider of their electricity needs. What is needed therefore is a method of monitoring the network that will allow for a more comprehensive analysis of the medium voltage network to be carried out which will permit a more proactive strategy to the monitoring and maintenance of the medium voltage lines. The monitoring will allow the electricity providers to carry out preventative maintenance on the power lines.

It is an object therefore of the present invention to provide a method of monitoring line faults in a medium voltage network that overcomes at least some of these difficulties and at the same time is cost efficient to implement.

SUMMARY OF THE INVENTION

According to the invention there is provided a method of monitoring line faults in a medium voltage network, the medium voltage network comprising an electricity generating plant supplying electricity to a plurality of customers over a network of medium voltage power lines, a control centre computer and a plurality of measurement sensors located remote from the electricity generating plant on the medium voltage power lines, each of the measurement sensors further comprising three individual measurement units, each measurement unit mounted on a different phase of the medium voltage power line with respect to the other measurement units of that measurement sensor, and each measurement sensor having means to communicate with the control centre computer, the method comprising the steps of:

the control centre computer transmitting a synchronization signal to each of the measurement sensors mounted on the medium voltage power lines;

the measurement units monitoring their respective medium voltage power lines and each measurement sensor determining the out of balance current, $I_B$, for the medium voltage power line upon which it is mounted on a cycle by cycle basis;

each of the measurement sensors determining whether or not there is a single cycle fault on its respective medium voltage power line; and on a measurement sensor determining that there is a single cycle fault on its respective medium voltage power line, the measurement sensor transmitting a line fault monitoring report to the control centre computer.

By having such a method it is possible to monitor the medium voltage network in a more comprehensive manner than was previously the case. By measuring the out of balance current on a cycle by cycle basis, it will be possible to measure the medium voltage network accurately regardless of whether the medium voltage lines are overhead lines or subterranean lines. Furthermore, by measuring the out of balance current on a cycle by cycle basis, the method will be able to more accurately monitor the condition of the line and will be able to detect any changes to the conditions of the line in a comprehensive manner. This in turn will enable the network operator to determine whether there are any minor single cycle faults on the line that may be happening on an infrequent basis as it is these faults that can in turn develop into more substantial faults. By detecting the faults on a cycle by cycle basis, the operator of the network will be able to predict if and when a more serious fault is likely to occur as well as the location of that fault. The operator will then be able to take preventative action if deemed necessary to avoid a black out of electricity on the line. This is also made possible in part due to the synchronization of the measurement sensors as they will be able to carry out the cycle by cycle measurements in a comprehensive manner. In this way, the system will also be able to look for sub-tripping faults. These faults may be indicative of the degradation in the quality of a network component. While the components causing the sub tripping faults may still be functional, they are at the end of their service life and should be replaced as a matter of priority. By having the method according to the present invention, preventative maintenance strategies may be undertaken by network operators thus improving the quality of service to the customer.

Furthermore, by using this method, the amount of communications used will be significantly reduced. Communications from the measurement sensor to the control centre computer are initiated on the measurement sensor detecting that there is a single cycle fault on the line as opposed to every measurement sample being transmitted to the control centre computer. Calculations are carried out on the measurement sensor which reduces the computational burden on the control centre computer. These significantly reduce the communications burden which in turn reduces the power requirements of the sensors and allows for radio communications to be used if desired which is inexpensive and reduces the overall cost to those persons implementing the system. Furthermore, by using this method, and due to the amount of measurement data involved, it is possible to store the data in memory on the sensors until it is necessary to transmit the data onwards to the control centre computer. This provides a more flexible method than was previously the case.

In one embodiment of the present invention there is provided a method of monitoring line faults in a medium voltage network in which the step of the measurement sensor measuring the out of balance current, $I_B$, further comprises the measurement sensor determining the phase and amplitude of the out of balance current. By measuring the phase and amplitude of the out of balance current the method will allow for the more accurate detection of faults and there will be less erroneous fault detection than was previously the case. A more detailed analysis of the medium voltage network will be possible and the measurement sensor will be able to determine the severity and the likely cause of a fault on the line.

In another embodiment of the invention there is provided a method of monitoring line faults in a medium voltage network in which the method further comprises the step of measuring the open delta voltage at the electricity generating plant and transmitting the open delta voltage measurements to each of the measurement sensors. By transmitting the open delta voltage measurements to each of the measurement sensors, the measurement sensors will be able to use the phase information of the open delta voltage in their calculations. By having the measurement sensors synchronized by the control centre computer, the measurements taken by the measurement sensors can each be correlated with the open delta voltage phase measurement.

In a further embodiment of the present invention there is provided a method of monitoring line faults in a medium voltage network in which the step of transmitting the open delta voltage measurements to each of the measurement sensors further comprises transmitting the phase of the open delta voltage to each of the measurement sensors and the measurement sensors each comparing the phase of the out of balance current, $I_B$, with the phase of the open delta voltage. This is seen as a particularly useful way of determining whether or not there is a fault on the line and where it is located. Furthermore, the comparison of the open delta voltage phase and the out of balance current phase can be carried out on the measurement sensor itself thereby removing the computational burden away from the control centre computer out to the measurement sensor. This comparison is relatively simple to carry out and will readily show any faults on the line which can be reported to the control centre computer in due course.

In one embodiment of the present invention there is provided a method of monitoring line faults in a medium voltage network in which on the phase of the out of balance current, $I_B$, and the phase of the open delta voltage being below a predetermined separation angle, the measurement sensor transmits a line fault monitoring report to the control centre computer. This is seen as a simple comparison that can be made on the measurement sensor that will identify any faults that are occurring on the medium voltage line at that time. The comparison may be carried out on the sensor itself remote from the control centre computer without placing excessive computational burden on the measurement sensor. By making the comparison on the measurement sensor, the fault detection process will be sped up, network traffic will be minimized and the use of the system of measurement sensors in control applications will be facilitated. It is envisaged that the fault condition could be relayed to a sectionalizing switch directly from the measurement sensor rather than to a central control computer in the instance of serious faults thereby improving further response times and network restoration speed.

In another embodiment of the invention there is provided a method of monitoring line faults in a medium voltage network in which on the amplitude of the out of balance current, $I_B$, being above a predetermined threshold, the measurement sensor generates and transmits a line fault monitoring report to the control centre computer. It is normal practice to use a common feeder (transformer) for a number of separate power lines. In the event of a fault occurring on a given line, certain electrical parameters on all of the lines fed from the common feeder will be affected. One of the parameters that will be affected is the out of balance current which is similar to the zero sequence current, the latter having a magnitude ⅓ times the former. By ensuring that the amplitude is above a predetermined threshold, it will be possible to ensure whether or not the line is actually experiencing a fault condition. Furthermore, it will be a relatively simple task that may once again be carried out on the measurement sensor in an efficient manner. In certain circumstances, where there is a significant amount of cable, it is not uncommon for the out of balance current on a healthy line to be as high or even higher than on a faulty line. The out of balance current can be dependent on the amount of high capacitance cable present in a distribution line. It is possible to discriminate by looking at the real component of the out of balance current. Therefore, for a positive fault condition detection, it is possible to determine the fault condition by first of all ensuring that the line current is above a minimum threshold and that the angle between the out of balance current and the open-delta voltage is less than a given value.

In a further embodiment of the present invention there is provided a method of monitoring line faults in a medium voltage network in which the method further comprises the step of each measurement sensor transmitting the measured out of balance current, $I_B$, to the next adjacent measurement sensor on the same medium voltage line downstream of the measurement sensor and thereafter the downstream measurement sensor determining the delta out of balance current, $\Delta I_B$. This is seen as particularly useful as the measurement sensors may read that there is a particularly high out of balance current on the line which is not necessarily indicative of a fault on the line. It is possible for the line to have a high out of balance current but for there to be no fault. By measuring the $\Delta I_B$, it is possible to determine whether there are significant changes between the out of balance currents measured at two or more consecutive measurement sensors and if so that there is a fault in that portion of the line.

In one embodiment of the present invention there is provided a method of monitoring line faults in a medium voltage network in which on the delta out of balance current, $\Delta I_B$, exceeding a predetermined value, the measurement sensor transmits a line fault monitoring report to the control centre computer. Again, the measurement sensor will be able to determine if the fault is sufficiently severe to warrant a fault monitoring report being sent to the control centre computer.

In another embodiment of the invention there is provided a method of monitoring line faults in a medium voltage network in which the method further comprises the step of the control centre computer storing the line fault monitoring report in memory together with the time at which the fault occurred. By storing the line fault monitoring report in memory along with the time that the fault occurred, it will be possible for the control centre computer to subsequently analyse the timing that the faults occurred along with the severity of the faults for a particular sensor or for a number of sensors. This may enable the control centre computer to determine the likely cause of the fault or the likely position of the fault on the line and will allow for more accurate subsequent analysis of faults and improved troubleshooting of faults.

In a further embodiment of the present invention there is provided a method of monitoring line faults in a medium voltage network in which the method further comprises the step of the control centre computer storing all the line fault monitoring reports from an individual measurement sensor together in memory. This is seen as highly beneficial as this way, calculations and analysis of a particular measurement sensor can be carried out in a very efficient manner by the control centre computer.

In one embodiment of the present invention there is provided a method of monitoring line faults in a medium voltage network in which the method further comprises the step of the control centre computer carrying out a diagnostic test using the line fault monitoring reports received from a measurement sensor. By carrying out a diagnostic test of the line fault monitoring reports taken from a measurement sensor, it will be possible for the control centre computer to ascertain the likely cause of a fault and the correct preventative measures to be taken to avoid a blackout condition. The analysis may be combined with other data such as weather information to allow a more comprehensive understanding of the cause and possible consequences of the faults.

In another embodiment of the invention there is provided a method of monitoring line faults in a medium voltage network in which the control centre computer carries out the diagnostic test subsequent to a predetermined number of line fault monitoring reports being received by the control centre computer from a measurement sensor. In this way, if a significant number of line fault monitoring reports are received by the control centre computer, a diagnostic test will be automatically carried out. This will ensure that if a sensor is detecting a significant number of faults, these faults will be brought to the attention of a responsible individual as soon as possible.

In a further embodiment of the present invention there is provided a method of monitoring line faults in a medium voltage network in which the control centre computer carries out the diagnostic test on a periodic basis. This is seen as advantageous a several faults may be very infrequent and will only show up periodically, these faults may not be of sufficient frequency to trigger an analysis of the line fault monitoring reports of that sensor although these faults could cause significant problems later on. For example, line fault measurement reports caused due to ingress of moisture may be very infrequent during the summer months but if these faults are happening every time there is inclement weather in the summer months which may be infrequent, this is a clear sign that there is a fault which should be rectified before the winter. This will be caught using a periodic check.

In one embodiment of the present invention there is provided a method of monitoring line faults in a medium voltage network in which the diagnostic test further comprises determining the frequency of a fault on a particular medium voltage line. By knowing the frequency of a fault, it is possible to determine the severity of the fault which will enable a medium voltage network operator decide the importance and whether priority should be given to the repair of a particular fault. Furthermore, by knowing the frequency of the fault it is possible to ascertain the likely cause of a fault whether it is caused due to faulty equipment or caused by some other problem on the line.

In another embodiment of the invention there is provided a method of monitoring line faults in a medium voltage network in which the diagnostic test further comprises comparing the line fault monitoring reports with environmental data taken for the surrounding area of the medium voltage line monitored by that measurement sensor. This is seen as useful as by comparing the environmental data with the line fault monitoring reports it will be possible to extrapolate the likely cause of many faults that are occurring. For example, the most common fault caused by inclement weather may be due to ingress of moisture into the cabling during heavy rainfall periods. It will be possible to combine the local meteorological data with the line fault monitoring reports to determine if a large number of the faults occur during periods of heavy rainfall in the area.

In a further embodiment of the present invention there is provided a method of monitoring line faults in a medium voltage network in which the diagnostic test further comprises comparing the line fault monitoring reports with construction data taken for the area surrounding the medium voltage line monitored by that measurement sensor. Quite often, medium voltage power lines are damaged due to construction and in particular due to road works carried out in the vicinity of the line. By comparing the construction data with the line fault monitoring reports it may be possible to determine if the likely cause of a fault was that the line was damaged due to, road works in the area and also the likely precise location of the fault. This will save considerably in the maintenance costs of the medium voltage network as well as significantly improve the repair times of the faults.

In one embodiment of the present invention there is provided a method of monitoring line faults in a medium voltage network in which the step of carrying out a diagnostic test further comprises the control centre computer ascertaining the probable cause of the fault and alerting a supervisor to the probable cause of the fault. By alerting the supervisor to the probable cause of a fault, it is possible for the supervisor to decide whether the fault requires immediate action to repair the fault before it causes a blackout or whether the maintenance can be put off until a later date.

In another embodiment of the invention there is provided a method of monitoring line faults in a medium voltage network in which the step of carrying out a diagnostic test further comprises the control centre computer ascertaining the probable location of the fault and alerting a supervisor to the probable location of the fault. By doing so, the supervisor can direct any repair team to the most likely location of the fault thereby significantly reducing the time taken to rectify the faults.

In a further embodiment of the present invention there is provided a method of monitoring line faults in a medium voltage network in which the step of transmitting a synchronization signal from the control centre computer to the measurement sensors further comprises transmitting a sampling rate and a start time to each of the measurement sensors, the sampling rate and the start time being the same for each measurement sensor on a medium voltage line. In this way, it is possible for each of the measurement sensors to obtain measurements at the same time as the other measurement sensors and therefore it is simpler for the operator of the medium voltage network to determine where exactly on the network the fault is occurring as well as the sequence of the faults being detected.

In one embodiment of the present invention there is provided a method of monitoring line faults in a medium voltage network in which the step of the measurement sensor determining the out of balance current, $I_B$, further comprises the measurement sensor using Fourier techniques to determine the out of balance current. This is seen as a particularly efficient way of calculating the out of balance current.

In another embodiment of the invention there is provided a method of monitoring line faults in a medium voltage network in which the steps of transmitting the synchronization signal to the measurement sensors and transmitting the line fault monitoring reports are carried out using radio transmissions. This is a simple and cost effective way of carrying out the transmission of the synchronization signals and furthermore is made possible due the relatively small amount of calculations that must be carried out.

DETAILED DESCRIPTION

Figure 1:
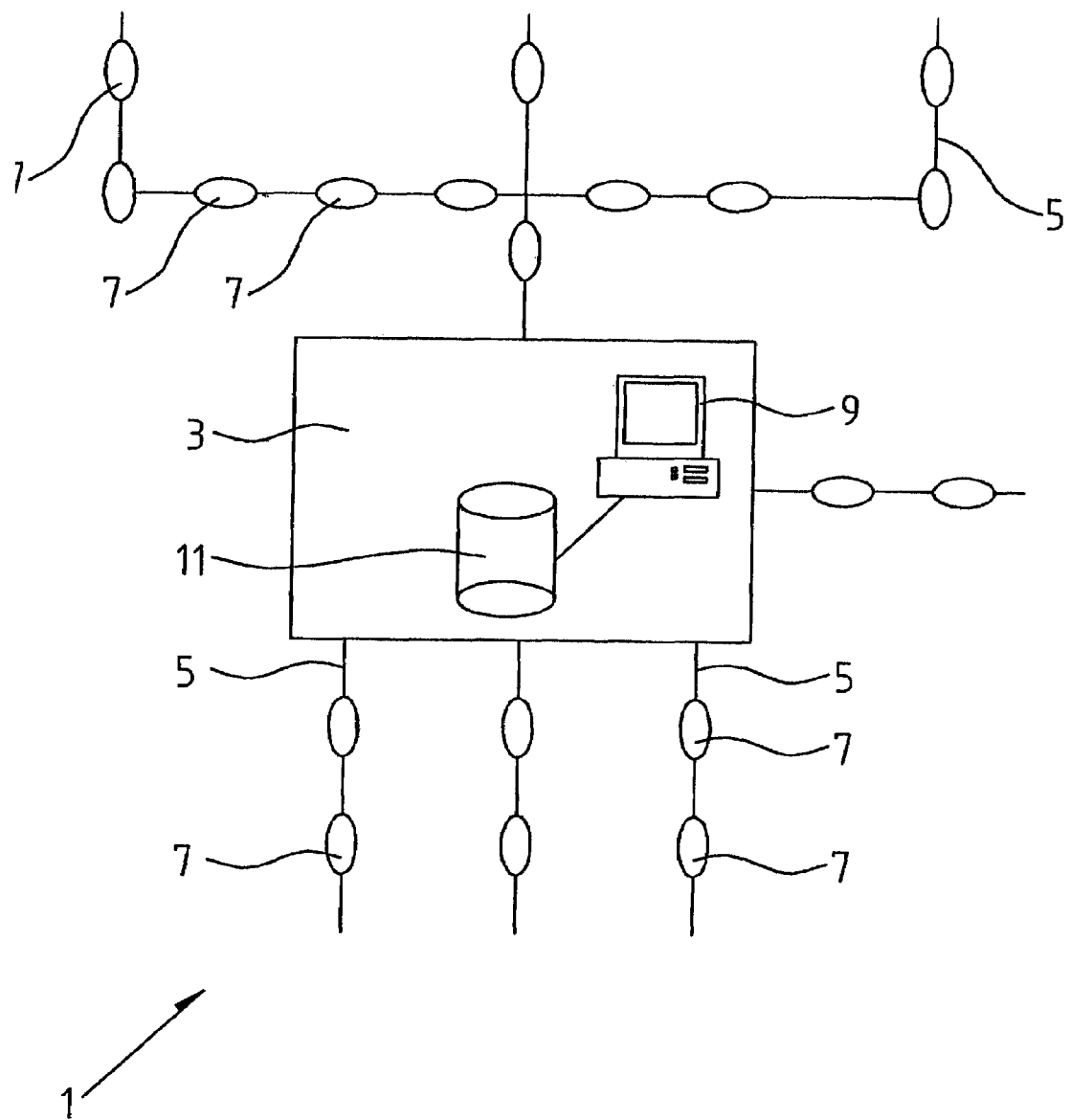
FIG. 1 is a schematic representation of a medium voltage network in which the method according to the invention is carried out.

The invention will now be more clearly understood from the following description of some embodiments thereof given by way of example only with reference to the accompanying drawings in which:

Referring to FIG. 1 there is shown a schematic representation of a medium voltage network, indicated generally by the reference numeral 1, comprising a substation 3 delivering electricity to a number of customers. (not shown) over a plurality of medium voltage power lines 5. A plurality of measurement sensors 7 are mounted on each of the lines, each of the measurement sensors having means to communicate (not shown) with a control centre computer 9 housed in the substation 3. The control centre computer is further provided with memory 11 for storage of measurement data.

In use, the control centre computer 9 transmits a synchronization signal to each of the measurement sensors 7 mounted on the power lines so that all of the measurement sensors monitoring a particular power line are in synchronization with the other measurement sensors on that line. The measurement sensors 7 measure the out of balance current, $I_B$, on a cycle by cycle basis. The control centre computer 9 measures the open delta voltage phase for that particular power line 5 at the substation 3 and transmits the value of the open delta voltage phase to the measurement sensors on that power line 5. Each of the measurement sensors may then accurately compare the phase of $I_B$ with the phase of the open delta voltage which distributes the processing burden and reduces network traffic. If the phase of the open delta voltage and the phase of $I_B$ are in phase with each other a fault condition is occurring on the line. In this instance, the measurement sensor will transmit a line fault monitoring report to the control centre computer. If the phase of the open delta voltage and the phase of $I_B$ are out of phase by a line dependent angle, commonly close to 90°, then no fault is occurring on the line and no report will have to be sent.

The control centre computer, on receiving a line fault monitoring report will store the report in memory 11 and will decide what action if any needs to be taken i.e. whether a service person needs to be sent out to the scene for further inspection. All of the faults relating to a particular sensor may be stored in a single place in memory as this will allow the faults to be analysed together quickly with a minimum of difficulty.

In order to determine whether or not a particular line is experiencing a fault, the open delta voltage is used in conjunction with the out of balance current. Two criteria may be used, the first of, which uses the component of the out of balance current that is in-phase with the open delta voltage, known as the real component, as a refined parameter in determining whether a line is faulty or not. The component must exceed a given threshold to qualify the condition as faulty. The second criteria uses the phase relationship between the open delta voltage and the out of balance current as part of the fault detection criteria. This requires that the phase difference lies within certain definable limits and the magnitude of the out of balance current is greater than a defined limit to qualify as a fault condition.

In this way, the sensors can be placed at any position on the network, close to or remote from the substation. The processing of the voltage and the current values can be carried out either on the sensors themselves or in the substation and a predetermined level can be associated with a fault condition, thereby allowing the system to handle sub-tripping faults. Finally, by having such a method the system can handle short duration detection algorithms, single cycle and shorter, and time averaged currents and voltages. This will allow the system to locate low level faults.

Figure 2:
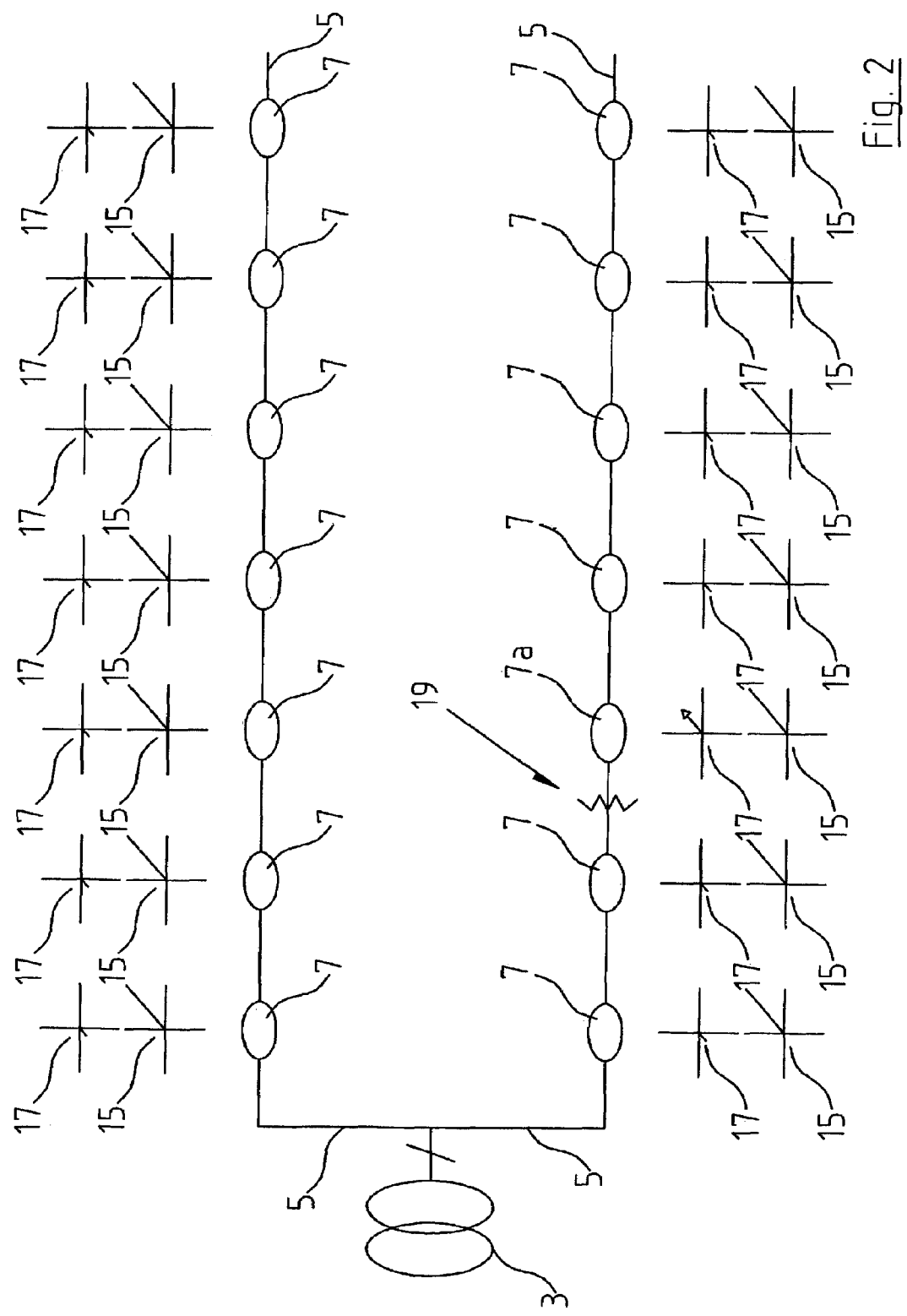
FIG. 2 is a schematic representation of a medium voltage network in which the method according to the invention is carried out showing phase and amplitude representations of various electrical parameters at different points in the network.

Referring to FIG. 2 of the drawings, where like parts have been given the same reference numerals as before, there is shown a schematic representation of a medium voltage network in which the method according to the invention is carried out showing phase and amplitude representations of various electrical parameters at different points in the network. A further method of locating the faults in the network will now be described with reference to the drawing. A current difference or delta out of balance current method can be employed to locate the faults. This technique has the effect of enhancing the system performance while using the open delta voltage values and further can act as a method of detecting faults independently of the open delta voltage altogether. This is made possible by the fact that there are several different sensors on a single line. In fault conditions it is noted, that the change in the capacitive component of the out of balance current changes dramatically only when a section of underground cable is introduced. By transmitting the values of out of balance current between the sensor triplets and by calculating the vectorial difference between the out of balance currents, the capacitive component of current can be nulled out revealing the fault current in the case of high impedance earth faults, either continuous or intermittent. On a healthy line the out of balance currents may in fact be high, in the region of several amps, the delta values should in fact be low, in the order of a fraction of an amp. The magnitude of this delta out of balance current effectively allows the system to recognise that the high out of balance current is not indicative of a fault on a healthy line. The delta out of balance current will be small if no fault exists provided that there is no intervening underground cable which of course will already be known when configuring the system.

As the delta out of balance current calculations are progressively carried out on the line units, each sensor unit will set or reset a fault flag. The fault flag will be set if the magnitude of the delta out of balance current exceeds a predetermined value. It can be seen from the diagram that the values of the out of balance current, shown on vectorial diagrams 15, for a given line may all remain practically constant, however, once a fault has been experienced on the line the delta out of balance current will be non-zero and a significant change in the value of the delta out of balance current will be detected, as shown on the vectorial diagrams 17. The sensor 7a down line of a fault 19 on the line will show a marked change in the value of the delta out of balance current. In this way the delta out of balance current may be used to detect any faults occurring on the line. If desired, the open delta voltage may be used to provide even greater discrimination. The type of cable used will not affect the application of this technique and the delta out of balance current approach will also operate on non cabled networks. Therefore, a single system may be used on all lines of a particular network and different systems dependent on the type of lines present in the network.

It is envisaged that by having each of the measurement sensors synchronized with the other measurement sensors and by carrying out cycle by cycle fault detection a much more accurate picture of the state of a network may be achieved thereby allowing the network operators to maintain their network in a more efficient manner. Faults on the medium voltage lines will be detected quickly before they can become a potential problem and preventative maintenance may be carried out which will further enhance the reliability of the network. By storing all of the data relating to a particular measurement sensor the operator will be able to determine when a particular fault arose on a line and they will then be able to correlate this data with other information such as when roadworks were carried out on a particular road that may have affected the integrity of the line and caused a fault. In this way the operators will be able to accurately guess where the most likely position of a fault is before having to dig up an entire stretch of road. In addition to this, the operator may be able to correlate the fault data with weather reports for a particular region which may also be of some use in determining what type of fault it could be. For example, if the fault normally occurred on a rainy day then there is a high chance that the fault is being caused by water ingress. Alternatively, if the fault is occurring randomly then it may be the result of simple wear and tear on the line. All of this enables the operator to be more prepared when handling faults on the line which can aid in reducing the cost of maintaining the line overall and providing a better service to the customer.

In this specification the terms "comprise, comprises, comprised and comprising" and the terms "include, includes, included and including" are deemed totally interchangeable and should be afforded the widest possible interpretation.

The invention is in no way limited to the embodiments hereinbefore described but may be varied in both construction and detail within the scope of the claims.

What is claimed is:

1. A method of monitoring line faults in a medium voltage network, the medium voltage network comprising an electricity generating plant supplying electricity to a plurality of customers over a network of medium voltage power lines, a control centre computer and a plurality of measurement sensors located remote from the electricity generating plant on the medium voltage power lines, each of the measurement sensors further comprising three individual measurement units, each measurement unit mounted on a different phase of the medium voltage power line with respect to the other measurement units of that measurement sensor, and each measurement sensor having means to communicate with the control centre computer, the method comprising the steps of:

the control centre computer transmitting a synchronization signal to each of the measurement sensors mounted on the medium voltage power lines;

the measurement units monitoring their respective medium voltage power lines and each measurement sensor determining the out of balance current, $I_B$, for the medium voltage power line upon which it is mounted on a cycle by cycle basis;

each of the measurement sensors determining whether or not there is a single cycle fault on its respective medium voltage power line; and on a measurement sensor determining that there is a single cycle fault on its respective medium voltage power line, the measurement sensor transmitting a line fault monitoring report to the control centre computer.

2. The method of monitoring line faults in a medium voltage network as claimed in claim 1 in which the step of the measurement sensor measuring the out of balance current, $I_B$, further comprises the measurement sensor determining the phase and amplitude of the out of balance current.

3. The method of monitoring line faults in a medium voltage network as claimed in claim 1 in which the method further comprises the step of measuring the open delta voltage at the electricity generating plant and transmitting the open delta voltage measurements to each of the measurement sensors.

4. The method of monitoring line faults in a medium voltage network as claimed in claim 3 in which the step of transmitting the open delta voltage measurements to each of the measurement sensors further comprises transmitting the phase of the open delta voltage to each of the measurement sensors and the measurement sensors each comparing the phase of the out of balance current, $I_B$, with the phase of the open delta voltage.

5. The method of monitoring line faults in a medium voltage network as claimed in claim 4 in which on the phase of the out of balance current, $I_B$, and the phase of the open delta voltage being below a predetermined separation angle, the measurement sensor transmits a line fault monitoring report to the control centre computer.

6. The method of monitoring line faults in a medium voltage network as claimed in claim 4 in which on the amplitude of the out of balance current, $I_B$, being above a predetermined threshold, the measurement sensor generates and transmits a line fault monitoring report to the control centre computer.

7. The method of monitoring line faults in a medium voltage network as claimed in claim 1 in which the method further comprises the step of each measurement sensor transmitting the measured out of balance current, $I_B$, to the next adjacent measurement sensor on the same medium voltage line downstream of the measurement sensor and thereafter the downstream measurement sensor determining the delta out of balance current, $\Delta I_B$.

8. The method of monitoring line faults in a medium voltage network as claimed in claim 7 in which on the delta out of balance current, $\Delta I_B$, exceeding a predetermined value, the measurement sensor transmits a line fault monitoring report to the control centre computer.

9. The method of monitoring line faults in a medium voltage network as claimed in claim 1, in which the method further comprises the step of the control centre computer storing the line fault monitoring report in memory together with the time at which the fault occurred.

10. The method of monitoring line faults in a medium voltage network as claimed in claim 9 in which the method further comprises the step of the control centre computer storing all the line fault monitoring reports from an individual measurement sensor together in memory.

11. The method of monitoring line faults in a medium voltage network as claimed in claim 9 in which the method further comprises the step of the control centre computer carrying out a diagnostic test using the line fault monitoring reports received from a measurement sensor.

12. The method of monitoring line faults in a medium voltage network as claimed in claim 11 in which the control centre computer carries out the diagnostic test subsequent to a predetermined number of line fault monitoring reports being received by the control centre computer from a measurement sensor.

13. The method of monitoring line faults in a medium voltage network as claimed in claim 11 in which the control centre computer carries out the diagnostic test on a periodic basis.

14. The method of monitoring line faults in a medium voltage network as claimed in claim 11 in which the diagnostic test further comprises determining the frequency of a fault on a particular medium voltage line.

15. The method of monitoring line faults in a medium voltage network as claimed in claim 11 in which the diagnostic test further comprises comparing the line fault monitoring reports with environmental data taken for the surrounding area of the medium voltage line monitored by that measurement sensor.

16. The method of monitoring line faults in a medium voltage network as claimed in claim 11 in which the diagnostic test further comprises comparing the line fault monitoring reports with construction data taken for the area surrounding the medium voltage line monitored by that measurement sensor.

17. The method of monitoring line faults in a medium voltage network as claimed in claim 11 in which the step of carrying out a diagnostic test further comprises the control centre computer ascertaining the probable cause of the fault and alerting a supervisor to the probable cause of the fault.

18. The method of monitoring line faults in a medium voltage network as claimed in claim 11 in which the step of carrying out a diagnostic test further comprises the control centre computer ascertaining the probable location of the fault and alerting a supervisor to the probable location of the fault.

19. The method of monitoring line faults in a medium voltage network as claimed in claim 1 in which the step of transmitting a synchronization signal from the control centre computer to the measurement sensors further comprises transmitting a sampling rate and a start time to each of the measurement sensors, the sampling rate and the start time being the same for each measurement sensor on a medium voltage line.

20. The method of monitoring line faults in a medium voltage network as claimed in claim 1 in which the step of the measurement sensor determining the out of balance current, $I_B$, further comprises the measurement sensor using Fourier techniques to determine the out of balance current.

21. The method of monitoring line faults in a medium voltage network as claimed in claim 1 in which the steps of transmitting the synchronization signal to the measurement sensors and transmitting the line fault monitoring reports are carried out using radio transmissions.

22. A method of monitoring line faults in a medium voltage network, the medium voltage network comprising an electricity generating plant supplying electricity to a plurality of customers over a network of medium voltage power lines, a control centre computer and a plurality of measurement sensors located remote from the electricity generating plant on the medium voltage power lines, each of the measurement sensors further comprising three individual measurement units, each measurement unit mounted on a different phase of the medium voltage power line with respect to the other measurement units of that measurement sensor, and each measurement sensor having means to communicate with the control centre computer, the method comprising the steps of:

the control centre computer transmitting a synchronization signal to each of the measurement sensors mounted on the medium voltage power lines;

measuring the open delta voltage at the electricity generating plant and transmitting the phase of the open delta voltage measurements to each of the measurement sensors;

the measurement units monitoring their respective medium voltage power lines and each measurement sensor determining the out of balance current, $I_B$, for the medium voltage power line upon which it is mounted on a cycle by cycle basis;

the measurement sensors each comparing the phase of the out of balance current, $I_B$, with the phase of the open delta voltage;

each of the measurement sensors determining whether or not there is a single cycle fault on its respective medium voltage power line; and on a measurement sensor determining that there is a single cycle fault on its respective medium voltage power line, the measurement sensor transmitting a line fault monitoring report to the control centre computer.

23. The method of monitoring line faults in a medium voltage network as claimed in claim 22 in which on the phase of the out of balance current, $I_B$, and the phase of the open delta voltage being below a predetermined separation angle, the measurement sensor transmits a line fault monitoring report to the control centre computer.

24. The method of monitoring line faults in a medium voltage network as claimed in claim 22 in which on the amplitude of the out of balance current, $I_B$, being above a predetermined threshold, the measurement sensor generates and transmits a line fault monitoring report to the control centre computer.

25. The method of monitoring line faults in a medium voltage network as claimed in claim 22 in which the method further comprises the step of each measurement sensor transmitting the measured out of balance current, $I_B$, to the next adjacent measurement sensor on the same medium voltage line downstream of the measurement sensor and thereafter the downstream measurement sensor determining the delta out of balance current, $\Delta I_B$.

26. The method of monitoring line faults in a medium voltage network as claimed in claim 25 in which on the delta out of balance current, $\Delta I_B$, exceeding a predetermined value, the measurement sensor transmits a line fault monitoring report to the control centre computer.

27. The method of monitoring line faults in a medium voltage network as claimed in claim 22, in which the method further comprises the step of the control centre computer storing the line fault monitoring report in memory together with the time at which the fault occurred.

28. The method of monitoring line faults in a medium voltage network as claimed in claim 27 in which the method further comprises the step of the control centre computer storing all the line fault monitoring reports from an individual measurement sensor together in memory.

29. The method of monitoring line faults in a medium voltage network as claimed in claim 27 in which the method further comprises the step of the control centre computer carrying out a diagnostic test using the line fault monitoring reports received from a measurement sensor.

30. A method of monitoring line faults in a medium voltage network, the medium voltage network comprising an electricity generating plant supplying electricity to a plurality of customers over a network of medium voltage power lines, a control centre computer and a plurality of measurement sensors located remote from the electricity generating plant on the medium voltage power lines, each of the measurement sensors further comprising three individual measurement units, each measurement unit mounted on a different phase of the medium voltage power line with respect to the other measurement units of that measurement sensor, and each measurement sensor having means to communicate with the control centre computer, the method comprising the steps of:

the control centre computer transmitting a synchronization signal to each of the measurement sensors mounted on the medium voltage power lines;

the measurement units monitoring their respective medium voltage power lines and each measurement sensor determining the out of balance current, $I_B$, for the medium voltage power line upon which it is mounted on a cycle by cycle basis;

each of the measurement sensors determining whether or not there is a single cycle fault on its respective medium voltage power line;

on a measurement sensor determining that there is a single cycle fault on its respective medium voltage power line, the measurement sensor transmitting a line fault monitoring report to the control centre computer;

the control centre computer storing the line fault monitoring report in memory together with the time at which the fault occurred; and the control centre computer carrying out a diagnostic test using the line fault monitoring reports received from the measurement sensor.

\* \* \* \* \*